United States Patent
Cho et al.

(10) Patent No.: US 8,455,854 B2
(45) Date of Patent: Jun. 4, 2013

(54) NONVOLATILE MEMORY DEVICE INCLUDING AMORPHOUS ALLOY METAL OXIDE LAYER AND METHOD OF MANUFACTURING THE SAME

(75) Inventors: Choong-Rae Cho, Yongin-si (KR); Sung-Il Cho, Yongin-si (KR); In-Kyeong Yoo, Yongin-si (KR); Eun-Hong Lee, Yongin-si (KR); Chang-Wook Moon, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 825 days.

(21) Appl. No.: 11/704,365

(22) Filed: Feb. 9, 2007

(65) Prior Publication Data
US 2007/0257257 A1 Nov. 8, 2007

(30) Foreign Application Priority Data

Feb. 20, 2006 (KR) .................. 10-2006-0016224

(51) Int. Cl.
*H01L 47/00* (2006.01)
(52) U.S. Cl.
USPC .................................................. 257/4
(58) Field of Classification Search
USPC .............. 257/421, 427, E29.167, E29.323, 257/E21.665, E21.009, E21.272, 4
See application file for complete search history.

(56) References Cited

U.S. PATENT DOCUMENTS

| 5,811,851 | A  | * | 9/1998 | Nishioka et al. | ............... | 257/310 |
| 6,614,178 | B1 | * | 9/2003 | Okada | ........................ | 313/509 |
| 7,259,387 | B2 |   | 8/2007 | Kawazoe et al. | | |
| 2005/0130374 | A1 | * | 6/2005 | Grynkewich et al. | ........ | 438/257 |
| 2005/0151277 | A1 |   | 7/2005 | Kawazoe et al. | | |
| 2006/0113565 | A1 | * | 6/2006 | Abe et al. | ..................... | 257/197 |
| 2006/0141640 | A1 | * | 6/2006 | Huai et al. | ........................ | 438/3 |

FOREIGN PATENT DOCUMENTS

| CN | 1641879 | 7/2005 |
| JP | 2005-203463 | 7/2005 |

OTHER PUBLICATIONS

English translation of Office Action dated Feb. 12, 2010 and issued in corresponding Chinese Application No. 2006101636363.
Japanese Office Action dated Aug. 31, 2010 with English Translation.
Matthew P. Taylor, et al., "The electrical, optical and structural properties of $In_xZn_{1-x}O_y$ ($0 \leq X \leq 1$) thin films by combinatorial techniques", Institute of Physics Publishing, Measurement Science and Technology vol. 16, pp. 90-94, published Dec. 16, 2004.
Applied Physics Letters, vol. 77, No. 1, Jul. 3, 2000, "Reproducible switching effect in thin oxide films for memory applications", A. Beck et al., http://dx.doi.org/10.1063/1.126902, pp. 139-141.
Applied Physics Letters, vol. 76, No. 19, May 8, 2000 "Electric-pulse-induced reversible resistance change effect in magnetoresistive films", S.Q. Liu et al., http://dx.doi.org/10.1063/1.126464, pp. 2749-2751.

* cited by examiner

*Primary Examiner* — Bradley K Smith
(74) *Attorney, Agent, or Firm* — Harness, Dickey & Pierce, P.L.C.

(57) ABSTRACT

A nonvolatile memory device may include a lower electrode, an oxide layer including an amorphous alloy metal oxide disposed on the lower electrode, and a diode structure disposed on the oxide layer.

10 Claims, 6 Drawing Sheets

IZO CROSS-SECTION SEM

IZO SURFACE SEM

NONVOLATILE MEMORY DEVICE INCLUDING AMORPHOUS ALLOY METAL OXIDE LAYER AND METHOD OF MANUFACTURING THE SAME

PRIORITY STATEMENT

This U.S. non-provisional application claims the benefit of priority of Korean Patent Application No. 10-2006-0016224, filed on Feb. 20, 2006, in the Korean Intellectual Property Office (KIPO), the disclosure of which is incorporated herein in its entirety by reference.

BACKGROUND

1. Field

Example embodiments relate to a nonvolatile memory device and method of manufacturing the same, for example, a nonvolatile memory device including an amorphous alloy metal oxide layer.

2. Description of the Related Art

In recent years, research has been conducted with respect to semiconductor memory devices that may increase the number of memory cells per area, for example, that may have higher integration density, increased operating speed, and/or may be driven by lower power.

In general, semiconductor memory devices may include a plurality of memory cells that are connected via circuits. For example, in a dynamic random access memory (DRAM), a unit memory cell may include one switch and one capacitor. Such a DRAM may have the advantage of higher integration density and higher operating speed. However, when power supply is cut off, the DRAM may lose all stored data.

Nonvolatile memory devices, for example, flash memory devices, may retain stored data even if the power supply is abruptly interrupted. Flash memory devices may have a nonvolatile characteristic, but flash memory devices may have lower integration density and slower operating speed than volatile memory devices.

For example, other nonvolatile memory devices being researched may include magnetic random access memory (MRAM) devices, ferroelectric random access memory (FRAM) devices, phase-change random access memory (PRAM) devices, and resistance random access memory (RRAM) devices.

RRAM devices may have a variable resistance characteristic such that resistance of transition metal oxide (TMO) may vary according to a voltage.

Figure 1:
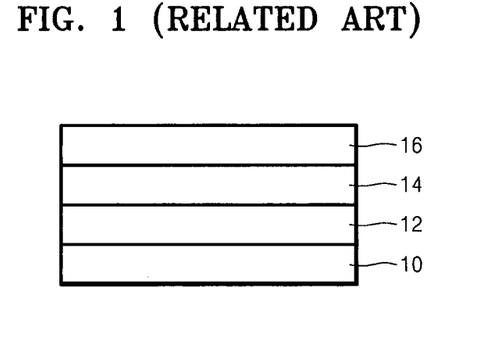
FIG. 1 illustrates a conventional structure of a resistance random access memory (RRAM) device that uses a variable resistance material.

FIG. 1A illustrates a structure of a RRAM device that may use a variable resistance material having a conventional structure. Referring to FIG. 1A, the RRAM device may include a substrate 10, a lower electrode 12, an oxide layer 14, and/or an upper electrode 16, which may be sequentially stacked. The lower electrode 12 and the upper electrode 16 may be formed of a conventional conductive material. The oxide layer 14 may be formed of TMO having the variable resistance characteristic. For example, the oxide layer 14 can be formed of $ZnO$, $TiO_2$, $Nb_2O_5$, $ZrO_2$, or $NiO$.

A Perovskite-RRAM device may use Perovskite oxide as a switching material group, PCMO ($PrCaMnO_3$) or Cr—STO ($SrTiO_3$) as an oxide layer, and may realize a memory characteristic according to a polarity applied to a memory node using a principle of Schottky barrier deformation.

The RRAM device using the TMO may have a switching characteristic that may allow it to act as a memory device. However, a crystalline thin film memory device using the TMO may be restricted to a micro-node.

Figure 2A:
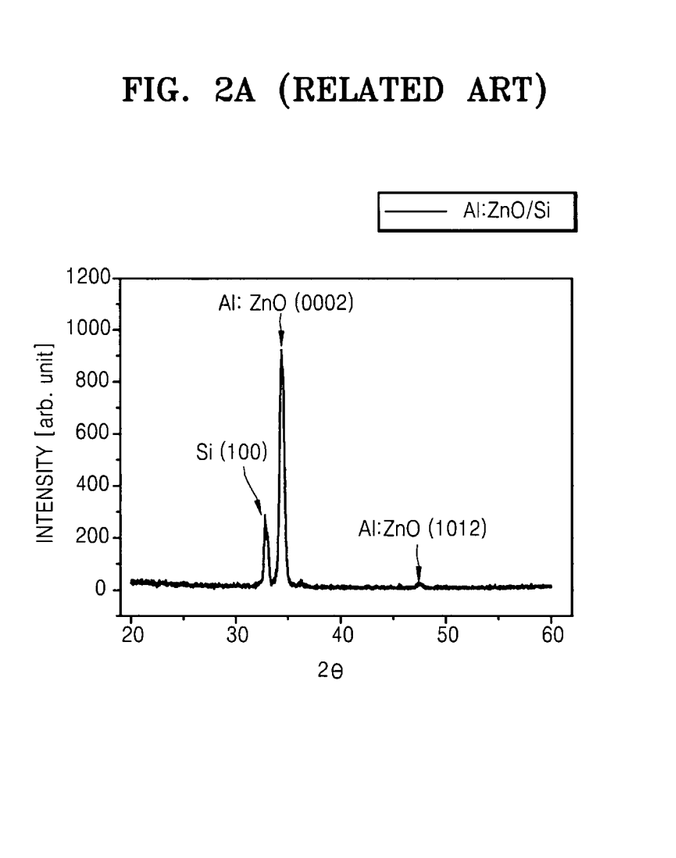
FIG. 2A is a graph illustrating crystallization of ZnO, which is a transition metal oxide (TMO), formed on an Si substrate using X-ray diffraction (XRD)

FIG. 2A is a graph illustrating crystallization of ZnO, which is a TMO, formed on a Si substrate using X-ray diffraction (XRD). Referring to FIG. 2A, a Si (100) peak, a ZnO (0002) peak, and a ZnO (10-12) peak may show a process of crystallization of ZnO.

Figure 2B:
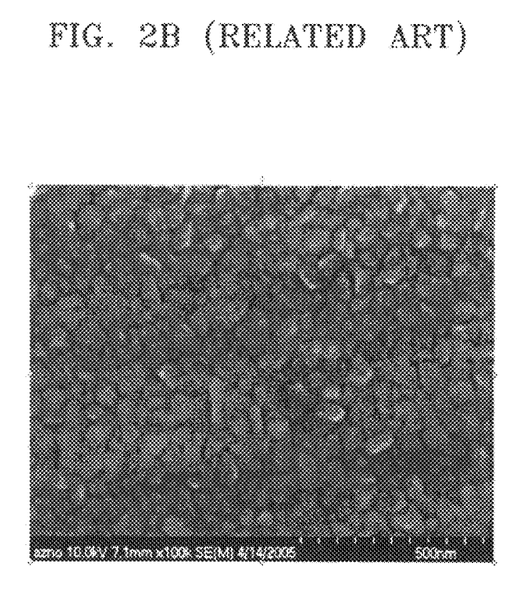
FIG. 2B is a scanning electron microscopy (SEM) photograph of the surface of ZnO, the crystallization of which is illustrated in the graph in FIG. 2A.

FIG. 2B is a scanning electron microscopy (SEM) photograph of the surface of ZnO, the crystallization of which is illustrated in the graph in FIG. 2A. Referring to FIG. 2B, when the oxide layer 14 of the RRAM device is crystallized, it may be difficult to realize a memory device having a uniform characteristic because grains may be large.

SUMMARY

Example embodiments may provide a nonvolatile memory device that may include an amorphous alloy metal oxide layer as a transition metal oxide (TMO) layer that may overcome a restriction imposed on a micro-node when a crystalline thin film is used as a resistance memory device.

In an example embodiment, a nonvolatile memory device may include a lower electrode, an amorphous alloy metal oxide layer disposed on the lower electrode, and an upper electrode disposed on the amorphous alloy metal oxide layer.

According to an example embodiment, the oxide layer may include at least a first transition metal and a second metal having a different crystalline characteristic from the first transition metal.

According to an example embodiment, the first transition metal may be one of Ni, Ti, Hf, Zr, Zn, W, Co, and Nb.

According to an example embodiment, the second metal may be one of Al and In.

According to an example embodiment, at least one of the lower and upper electrodes may form a Schottky-junction with the oxide layer.

According to an example embodiment, the oxide layer may be formed of n-type oxide, and one of the lower and upper electrodes may be formed of one of Pt, Ir, Ru, and an oxide of Pt, Ir, and Ru.

According to an example embodiment, the oxide layer may be formed of a p-type oxide, and one of the lower and upper electrodes may be formed of one of Ti and Ag.

According to an example embodiment, the upper electrode may be connected to a diode structure.

In an example embodiment, a method of manufacturing a nonvolatile memory device may include forming a lower electrode, forming an amorphous alloy metal oxide layer on the lower electrode, and forming an upper electrode on the amorphous alloy metal oxide layer.

According to an example embodiment, the oxide layer may include at least a first transition metal and a second metal having a different crystalline characteristic from the first transition metal.

According to an example embodiment, the first transition metal may be one of Ni, Ti, Hf, Zr, Zn, W, Co, and Nb.

According to an example embodiment, the second metal may be one of Al and In.

According to an example embodiment, at least one of the lower and upper electrodes may form a Schottky-junction with the oxide layer.

According to an example embodiment, the oxide layer may be formed of n-type oxide, and one of the lower and upper electrodes may be formed of one of Pt, Ir, Ru, and an oxide of Pt, Ir, and Ru.

According to an example embodiment, the oxide layer may be formed of a p-type oxide, and one of the lower and upper electrodes may be formed of one of Ti and Ag.

According to an example embodiment, the upper electrode may be connected to a diode structure.

BRIEF DESCRIPTION OF THE DRAWINGS

Example embodiments will be described with reference to the accompanying.

DESCRIPTION OF EXAMPLE EMBODIMENTS

Example embodiments will now be described more with reference to the accompanying drawings. Example embodiments may, however, be embodied in many different forms and should not be construed as being limited to the example embodiments set forth herein. Rather, these example embodiments are provided so that this disclosure will be thorough, and will fully convey the scope to those skilled in the art. In the drawings, the thickness of layers and regions are exaggerated for clarity.

It will be understood that when an element or layer is referred to as being "on", "connected to" or "coupled to" another element or layer, it may be directly on, connected or coupled to the other element or layer or intervening elements or layers may be present. In contrast, when an element is referred to as being "directly on," "directly connected to" or "directly coupled to" another element or layer, there may be no intervening elements or layers present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Thus, a first element, component, region, layer or section discussed below could be termed a second element, component, region, layer or section without departing from the teachings of the example embodiments.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting. As used herein, the singular forms "a", "an" and "the" may be intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 3:
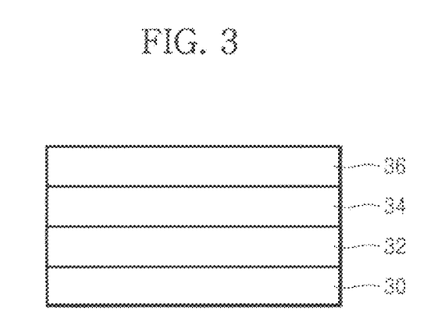
FIG. 3 illustrates a structure of a nonvolatile memory device including an amorphous alloy metal oxide layer according to an example embodiment.

FIG. 3 illustrates a structure of a nonvolatile memory device including an amorphous alloy metal oxide layer according to an example embodiment.

Referring to FIG. 3, the memory device may include a substrate 30, a lower electrode 32, an oxide layer 34 formed of an amorphous material, and/or an upper electrode 36, which may be sequentially stacked.

The substrate 30 may be formed of a material used for a conventional semiconductor substrate. For example, the substrate 30 may be formed of Si, SiO2, and SiC.

The amorphous oxide layer 34 may be formed of a variable resistance material, for example, an alloy metal oxide including at least two metals having different crystalline characteristics. At least one of the at least two metals may be a transition metal. For example, the transition metal may be Ni, Ti, Hf, Zr, Zn, W, Co, or Nb, and the transition metal oxide may be NiO, $TiO_2$, HfO, ZrO, ZnO, $WO_3$, CoO, or $Nb_2O_5$. For example, at least one of the at least two metals may be Al ($Al_2O_3$) or In ($In_2O_3$), or another metal having a different crystalline characteristic from the transition metal.

The lower and upper electrodes 32 and 36 may be formed of a conductive material. At least one of the lower and upper electrodes 32 and 36 may form a Schottky-junction with the oxide layer 34. For example, if the oxide layer 34 is formed of n-type oxide, for example, InZnOx, at least one of the lower and upper electrodes 32 and 36 may be formed of one of Pt, Ir, Ru, and an oxide of Pt, Ir, and Ru. If the oxide layer 34 is formed of a p-type oxide, for example, NiO, at least one of the lower and upper electrodes 32 and 36 may be formed of a material having a lower work function, for example, Ti or Ag.

As described above, the nonvolatile memory device may include the oxide layer 34 formed of amorphous alloy metal oxide.

Figure 4A:
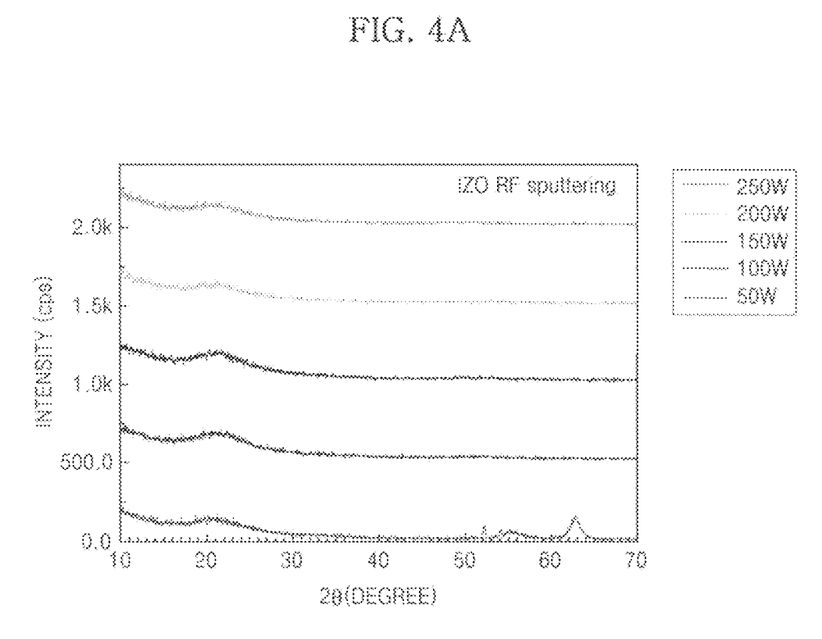
FIG. 4A is a graph illustrating crystallization of an $In_2O_3$—ZnO (IZO) thin film using XRD with respect to a sample of an oxide layer formed of InZnOx (0.5<x<1.5).
Figure 4B:
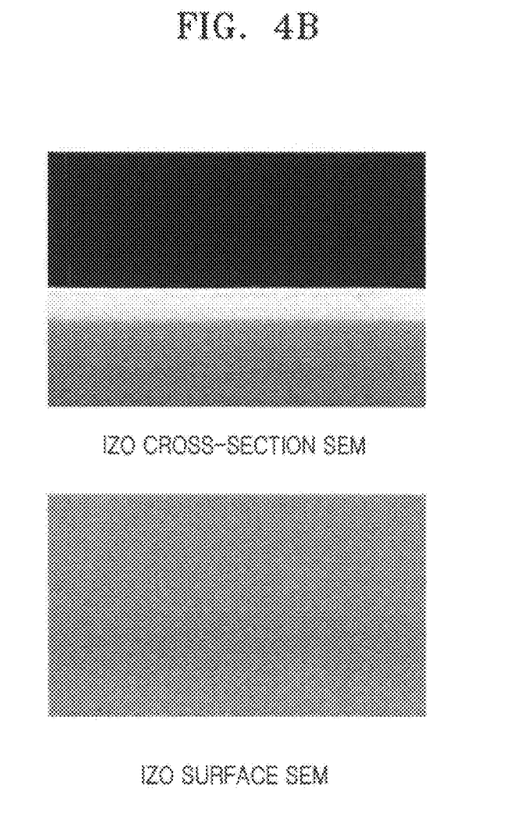
FIG. 4B are SEM photographs of the cross-section and surface of the IZO thin film, a graph of the crystallization of which is illustrated in FIG. 4A.

FIG. 4A is a graph illustrating crystallization of an $In_2O_3$—ZnO (IZO) thin film using X-ray diffraction (XRD) with respect to a sample of the oxide layer 34 formed of InZnOx (0.5<x<1.5). FIG. 4B are SEM photographs of a cross-section and a surface of the IZO thin film, the crystallization of which is illustrated in the graph in FIG. 4A.

Referring to FIG. 4A, the IZO thin film may not be completely crystallized, which may indicate that the IZO thin film deposited as the oxide layer 34 may be entirely amorphous. Referring to the SEM photographs of FIG. 4B, the cross-section and of the surface of the IZO thin film may indicate that grains may not be completely formed because the IZO thin film is amorphous.

IZO thin film does not have an amorphous characteristic in the ratio in the whole composition of In and Zn, but the IZO thin film may have an amorphous characteristic at the range of about 45 at % to about 80 at % of the composition of In. Therefore, the IZO thin film may be used as amorphous transition metal oxide having the amorphous characteristic at the range of about 45 at % to about 80 at % of the composition of In.

Figure 5:
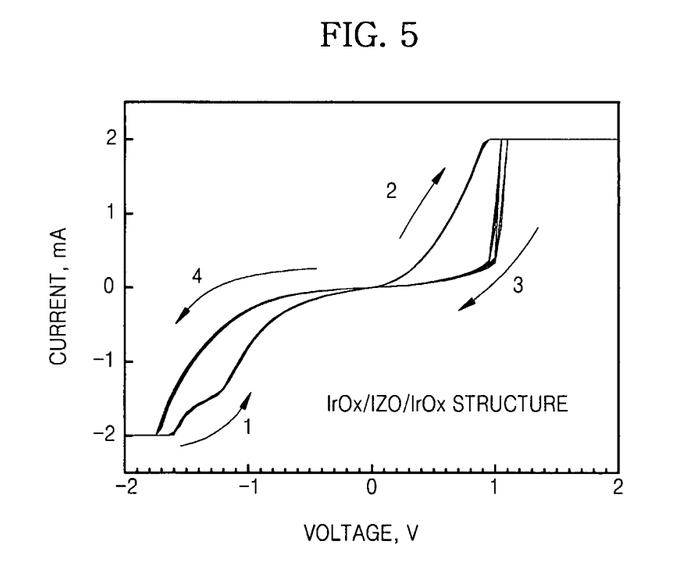
FIG. 5 is a graph illustrating a switching characteristic of a nonvolatile memory device including an amorphous alloy metal oxide layer according to an example embodiment.

FIG. 5 is a graph illustrating a switching characteristic of a nonvolatile memory device including an amorphous alloy metal oxide layer according to an example embodiment. A test may be performed on a sample of the lower electrode 32 formed of IrOx, the oxide layer 34 formed of InZnOx, and the upper electrode 36 formed of IrOx. Referring to FIG. 5, a current value in units of mA of the oxide layer 34 may be measured by gradually applying a voltage ten times to the sample, from −3 V to +3 V and back again from +3 V to −3 V.

If the voltage from −3 V to 0 V is increasingly applied to the sample, the current value in units of mA of the oxide layer 34 may increase along a first curve. If the voltage from 0 V to +3 V is increasingly applied to the sample, the current value in units of mA of the oxide layer 34 may increase along a second curve. If the voltage from +3 V to 0 V is decreasingly applied to the sample, the current value in units of mA of the oxide layer 34 may decrease along a third curve. If the voltage from 0 V to −3 V is decreasingly applied to the sample, the current value in units of mA of the oxide layer 34 may decrease along a fourth curve.

The oxide layer 34 may have a different current value in the first and fourth curves in the range of the voltage from −2 V to 0 V. The oxide layer 34 may have a different current value in the second and third curves in the range of the voltage from 0 V to 1 V. For example, if the voltage of −1 V is applied to the sample, the oxide layer 34 may have a resistance state according to the first curve or the fourth curve. The first and second curves may be in a low resistance state (LRS), and the third and fourth curves may be in the high resistance state (HRS).

To determine the switching characteristic used by the memory device, the test may be repeated ten times to achieve a consistent result.

Figure 6A:
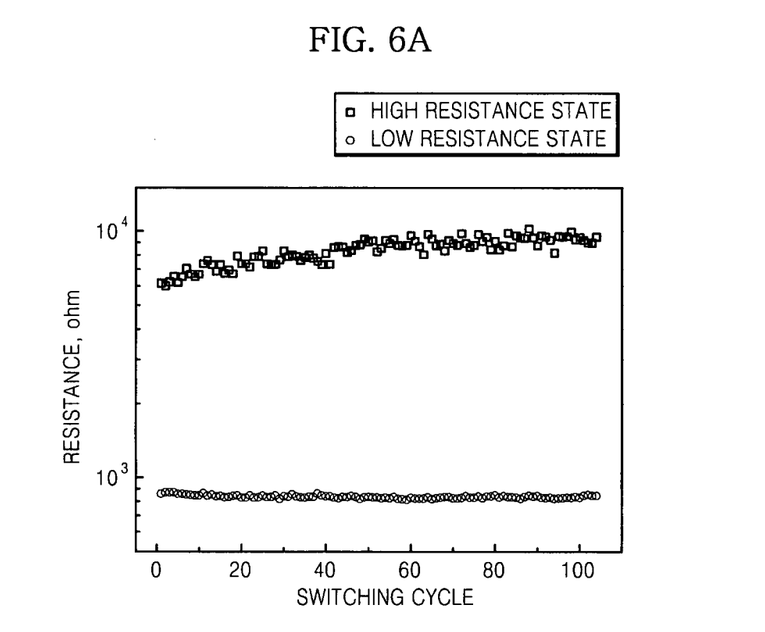
FIG. 6A is a graph illustrating an endurance characteristic of a nonvolatile memory device including an amorphous alloy metal oxide layer according to an example embodiment.

FIG. 6A is a graph illustrating an endurance characteristic of a nonvolatile memory device including an amorphous alloy metal oxide layer according to an example embodiment. A test may be performed on a sample of the lower electrode 32 formed of IrOx, the oxide layer 34 formed of InZnOx, and the upper electrode 36 formed of IrOx. Referring to FIG. 6A, each resistance value of the sample may be measured when the oxide layer 34 is in the LRS and the HRS by a sweeping process of applying a voltage 100 times to the sample, from −3 V to +3 V and back again from +3 V to −3 V.

The graph shows that each resistance value of the sample in the LRS and the HRS may remain consistent despite the repetitive sweeping process. An example embodiment of the nonvolatile memory device using the amorphous transition metal oxide may have improved reproducibility.

Figure 6B:
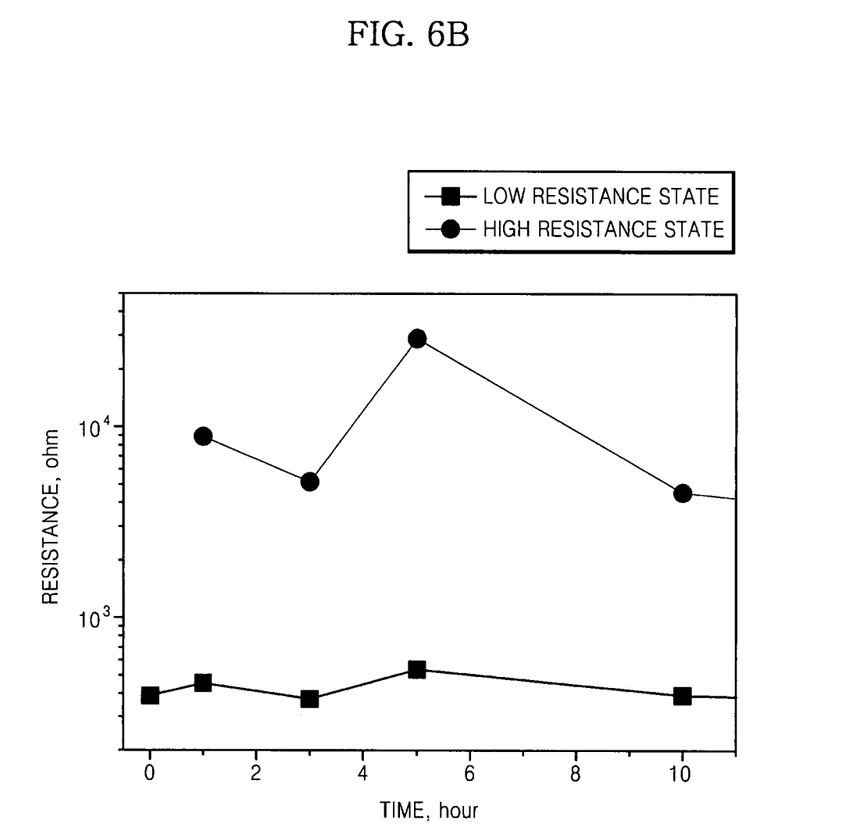
FIG. 6B is a graph illustrating a retention characteristic of a nonvolatile memory device including an amorphous alloy metal oxide layer according to example an embodiment.

FIG. 6B is a graph illustrating a retention characteristic of a nonvolatile memory device including an amorphous alloy metal oxide layer according to an example embodiment. In FIGS. 5 and 6A, a sample of the lower electrode 32 formed of IrOx, the oxide layer 34 formed of InZnOx, and the upper electrode 36 formed of IrOx may be used for a test as illustrated. Referring to FIG. 6B, to examine the retention characteristic of the nonvolatile memory device including the amorphous alloy metal oxide layer, resistance values of the sample in the LRS and the HRS may be measured for 10 hours at about 10° C. As a result, the resistance values of the sample may remain consistent in the LRS. The resistance values of the sample may have a little variation in the HRS, and therefore may be distinguished from the resistance values of the sample in the LRS. Thus, the retention characteristic of the nonvolatile memory device including the amorphous alloy metal oxide layer may remain stable.

An example embodiment of the nonvolatile memory device may include the lower electrode 32, the oxide layer 34 formed of amorphous alloy metal, and the upper electrode 36 may be a metal-insulator-metal (MIM) memory device that may use the oxide layer 34 as a memory node. At least one of the lower and upper electrodes 32 and 36 may form a Schottky-junction with the oxide layer 34.

The memory structure may be a 1T (transistor)-1R (resistance) structure connected to a source or a drain of a transistor structure, a 1D (diode)-1R structure connected to a diode structure, or an array structure in the form of a cross point.

Example embodiments of the nonvolatile memory device including the amorphous alloy metal oxide layer may be formed using conventional DRAM manufacturing processes.

Example embodiments of the nonvolatile memory device including the amorphous transition metal oxide layer may have a high density due to a reduction of the size of a memory node, and may have a stable variation (resistance variation) in current values with respect to applied voltages, so that the memory node may be used as a reliable memory device.

While example embodiments have been particularly shown and described, it will be understood by those of ordinary skill in the art that various changes in form and details may be made therein without departing from the spirit and scope of the example embodiments as defined by the following claims.

What is claimed is:

1. A nonvolatile memory device, comprising:
   a lower electrode;
   an amorphous alloy metal oxide layer directly disposed on the lower electrode; and
   a upper electrode disposed on the amorphous alloy metal oxide layer,
   wherein the amorphous alloy metal oxide layer is a memory node and formed of a variable resistance material,
   wherein the amorphous alloy metal oxide layer includes at least a first transition metal and a second metal having a different crystalline characteristic from the first transition metal,
   wherein the first transition metal is one of Ni, Ti, Hf, Zr, W, Co, and Nb, and wherein the second metal is one of Al and In.

2. The nonvolatile memory device of claim 1, wherein at least one of the lower and upper electrodes forms a Schottky junction with the amorphous alloy metal oxide layer.

3. The nonvolatile memory device of claim 2, wherein the amorphous alloy metal oxide layer is formed of n-type oxide and one of the lower and upper electrodes is formed of one of Pt, Ir, Ru, and an oxide of Pt, Ir, and Ru.

4. The nonvolatile memory device of claim 2, wherein the amorphous alloy metal oxide layer is formed of a p-type oxide and one of the lower and upper electrodes is formed of one of Ti and Ag.

5. The nonvolatile memory device of claim 1, wherein the upper electrode is connected to a diode structure.

6. A method of manufacturing a nonvolatile memory device, comprising:
 forming a lower electrode;
 forming an amorphous alloy metal oxide layer directly on the lower electrode; and
 forming an upper electrode on the amorphous metal alloy layer,
 wherein the amorphous alloy metal oxide layer is a memory node and formed of a variable resistance material,
 wherein the amorphous alloy metal oxide layer includes at least a first transition metal and a second metal having a different crystalline characteristic from the first transition metal,
 wherein the first transition metal is one of Ni, Ti, Hf, Zr, W, Co, and Nb, and
 wherein the second metal is one of Al and In.

7. The method of claim 6, wherein at least one of the lower and upper electrodes forms a Schottky-junction with the amorphous alloy metal oxide layer.

8. The method of claim 7, wherein the amorphous alloy metal oxide layer is formed of n-type oxide and one of the lower and upper electrodes is formed of one of Pt, Ir, Ru, and an oxide of Pt, Ir, and Ru.

9. The method of claim 7, wherein the amorphous alloy metal oxide layer is formed of a p-type oxide and one of the lower and upper electrodes is formed of one of Ti and Ag.

10. The method of claim 6, further comprising connecting the upper electrode to a diode structure.

* * * * *